(12) United States Patent
Ayazi et al.

(10) Patent No.: US 8,450,913 B1
(45) Date of Patent: May 28, 2013

(54) TUNABLE PIEZOELECTRIC MEMS RESONATORS SUITABLE FOR REAL-TIME CLOCK APPLICATIONS

(75) Inventors: Farrokh Ayazi, Atlanta, GA (US); Diego Emilio Serrano, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 326 days.

(21) Appl. No.: 13/077,545

(22) Filed: Mar. 31, 2011

(51) Int. Cl.
  *H01L 41/047* (2006.01)
  *H01L 41/053* (2006.01)
  *H01L 41/08* (2006.01)

(52) U.S. Cl.
  USPC .......................... 310/366; 310/328; 310/348

(58) Field of Classification Search
  USPC ......................................... 310/328, 348, 366
  See application file for complete search history.

(56) References Cited

U.S. PATENT DOCUMENTS

| | | | | |
|---|---|---|---|---|
| 3,488,530 | A * | 1/1970 | Staudte | 310/348 |
| 4,349,183 | A * | 9/1982 | Wirt et al. | 267/160 |
| 7,057,330 | B2 * | 6/2006 | Buhler et al. | 310/339 |
| 7,443,258 | B2 | 10/2008 | Hagelin | |
| 7,446,620 | B2 | 11/2008 | Partridge et al. | |
| 7,545,239 | B2 | 6/2009 | Hagelin et al. | |
| 7,859,365 | B2 | 12/2010 | Ho et al. | |
| 2006/0070440 | A1 * | 4/2006 | Challoner et al. | 73/504.12 |
| 2010/0176899 | A1 * | 7/2010 | Schaufele et al. | 333/187 |
| 2010/0219723 | A1 * | 9/2010 | Nozoe et al. | 310/348 |
| 2010/0223987 | A1 * | 9/2010 | Konno et al. | 73/150 R |
| 2011/0181150 | A1 * | 7/2011 | Mahameed et al. | 310/328 |
| 2012/0074818 | A1 * | 3/2012 | Crowley et al. | 310/348 |

OTHER PUBLICATIONS

Cioffi K.R. et al., "32KHz MEMS-Based Oscillator for Low-Power Applications", *Proceedings of the IEEE Frequency Control Symposium and Exposition*, pp. 551-558, Aug. 29-31, 2005.
Geetha, D. Mohana et al., "Optical MEMS Electrostatic Actuators with various Beam Configurations", *Recent Advances in Microwave Theory and Applications, Proceedings of International Conference on Microwave*, Nov. 21-24, 2008, pp. 757-760.
Pomarico A. et al., "Vertical MEMS Resonators for Real-Time Clock Applications" *Journal of Sensors*, vol. 2010, Article ID 362439, 5 pages, 2010.
Serrano D.E. et al., "Tunable Piezoelectric MEMS Resonators for Real-Time Clock", *Frequency Control and the European Frequency and Time Forum (FCS), 2011 Joint Conference of the IEEE International*, May 2-5, 2011, pp. 1-4.

* cited by examiner

*Primary Examiner* — Thomas Dougherty
(74) *Attorney, Agent, or Firm* — Myers Bigel Sibley & Sajovec, P.A.

(57) ABSTRACT

A microelectromechanical resonator can include a suspended frame-shaped beam anchored at four corners thereof to a surrounding substrate along with a suspended resonator plate tethered on four sides thereof to corresponding sides of the frame-shaped beam. A pair of drive electrodes are provided on first and third diametrically opposite corners of the frame-shaped beam and a pair of sense electrodes are provided on second and fourth diametrically opposite corners of the frame-shaped beam. The resonator may also include a ground electrode on the frame-shaped beam and a piezoelectric layer sandwiched between each of the drive and sense electrodes and the ground electrode.

20 Claims, 6 Drawing Sheets

TUNABLE PIEZOELECTRIC MEMS RESONATORS SUITABLE FOR REAL-TIME CLOCK APPLICATIONS

FIELD OF THE INVENTION

The present invention relates to electromechanical devices and, more particularly, to microelectromechanical resonators.

BACKGROUND OF THE INVENTION

Frequency references provided by oscillators are required in every clocked electronic system, including communication circuits, microprocessors, and signal processing circuits. The operating frequency typically used in time control applications is 32.768 kHz. Oscillators frequently consist of high performance piezoelectric crystals, such as quartz oscillators. The advantages of quartz oscillators are their stable operating frequency and high quality factor. However, the disadvantages of quartz oscillators are their relatively large size and unsuitability for high integration with electronic circuitry (e.g., CMOS circuits).

Based on these limitations of conventional oscillators, there is a strong interest in the development of fully integrated silicon oscillators. Integration is important not only for reduced size but also reduced power consumption. It is possible to realize an integrated silicon oscillator using the mechanical properties of silicon devices. For example, silicon microelectromechanical (MEMs) resonators can provide small form factor, ease of integration with conventional semiconductor fabrication techniques and high f.Q products. Accordingly, MEMs resonators are considered a desirable alternative to quartz resonators in real-time clock applications. One example of a silicon-based MEMs resonator that may be used for real-time clock applications is disclosed in an article by A. Pomarico et al., entitled "Vertical MEMS Resonators for Real-Time Clock Applications," Journal of Sensors, Vol. 2010, Article ID 362439.

SUMMARY OF THE INVENTION

Microelectromechanical resonators can be operated in various flexural modes to thereby achieve real-time clock frequencies (e.g., 32.768 kHz) with tunable frequency control. According to some of these embodiments of the invention, a microelectromechanical resonator can include a suspended frame-shaped beam (e.g., monocrystalline silicon) anchored at four corners thereof to a surrounding substrate along with a suspended resonator plate tethered on four sides thereof to corresponding sides of the frame-shaped beam. A pair of drive electrodes are provided on first and third diametrically opposite corners of the frame-shaped beam and a pair of sense electrodes are provided on second and fourth diametrically opposite corners of the frame-shaped beam. The resonator may also include a ground electrode on the frame-shaped beam and a piezoelectric layer sandwiched between each of the drive and sense electrodes and the ground electrode.

According to some embodiments of the invention, the resonator plate and the four sides of the frame-shaped beam are suspended opposite a semiconductor handle layer and a buried electrically insulating layer is provided that extends between the semiconductor handle layer and the four corners of the frame-shaped beam. A tuning electrode may also be provided, which is electrically coupled to a portion of the semiconductor handle layer extending opposite the resonator plate. A first side of the frame-shaped beam may have a length $L_1$ and a first of the pair of drive electrodes may overlap the first side of the frame-shaped beam by a length $L_2$, which is equal to about one-third $L_1$.

A piezoelectric resonator according to additional embodiments of the invention includes a quad-arrangement of suspended beams anchored at respective first ends thereof to a substrate and a quad-arrangement of electrodes on the first ends of the quad-arrangement of suspended beams. A suspended electrode-free mass-compensating plate is also provided, which is anchored on respective sides thereof to corresponding ones of the quad-arrangement of suspended beams. This mass-compensating plate may include at least one coupling spring. The resonator may also include a tuning electrode, which is capacitively coupled to the mass-compensating plate. The substrate may further include a buried electrically insulating layer, which is sandwiched between first and second single crystal semiconductor layers. According to additional aspects of these embodiments of the invention, each of the quad-arrangement of suspended beams is arranged in a clamped-clamped beam configuration. In particular, the quad-arrangement of suspended beams may include a frame-shaped beam anchored at four corners thereof to the substrate. The mass-compensating plate may also be tethered on four sides thereof to corresponding sides of the frame-shaped beam.

A micromechanical resonator according to additional embodiments of the invention may include a first semiconductor layer and a buried electrically insulating layer on the first semiconductor layer. This buried electrically insulating layer may have an opening therein that exposes an upper surface of the first semiconductor layer. A second semiconductor layer may also be provided on the buried electrically insulating layer. This second semiconductor layer can include a suspended frame-shaped beam anchored at four corners thereof to surrounding portions of the second semiconductor layer, along with an electrode-free resonator plate that is tethered on four sides thereof to corresponding sides of the frame-shaped beam. A pair of drive electrodes are provided on first and third diametrically opposite corners of the frame-shaped beam and a pair of sense electrodes are provided on second and fourth diametrically opposite corners of the frame-shaped beam. According to aspects of these embodiments of the invention, the electrode-free resonator plate is suspended opposite the opening in the buried electrically insulating layer. The resonator may also include a frequency tuning electrode on the second semiconductor layer, which is electrically coupled to a portion of the first semiconductor layer within the opening in the buried electrically insulating layer. A ground electrode may also be provided on the frame-shaped beam along with a piezoelectric layer, which is sandwiched between each of the drive and sense electrodes and the ground electrode. The ground electrode can be capacitively coupled to the portion of the first semiconductor layer within the opening.

These embodiments of the invention can be engineered to exhibit a low resonance frequency of operation (e.g., 32.768 kHz) while maintaining a small form factor, with electrostatic frequency tuning and relatively low insertion loss. These embodiments may also be implemented on a thin-film AlN-on-SOI substrate to enable piezoelectric transduction.

DETAILED DESCRIPTION OF PREFERRED EMBODIMENTS

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that when an element or layer is referred to as being "on," "connected to" or "coupled to" another element or layer (and variants thereof), it can be directly on, connected or coupled to the other element or layer or intervening elements or layers may be present. In contrast, when an element is referred to as being "directly on," "directly connected to" or "directly coupled to" another element or layer (and variants thereof), there are no intervening elements or layers present. Like reference numerals refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Embodiments of the present invention are described herein with reference to cross-section and perspective illustrations that are schematic illustrations of idealized embodiments (and intermediate structures) of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a sharp angle may be somewhat rounded due to manufacturing techniques/tolerances.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1A:
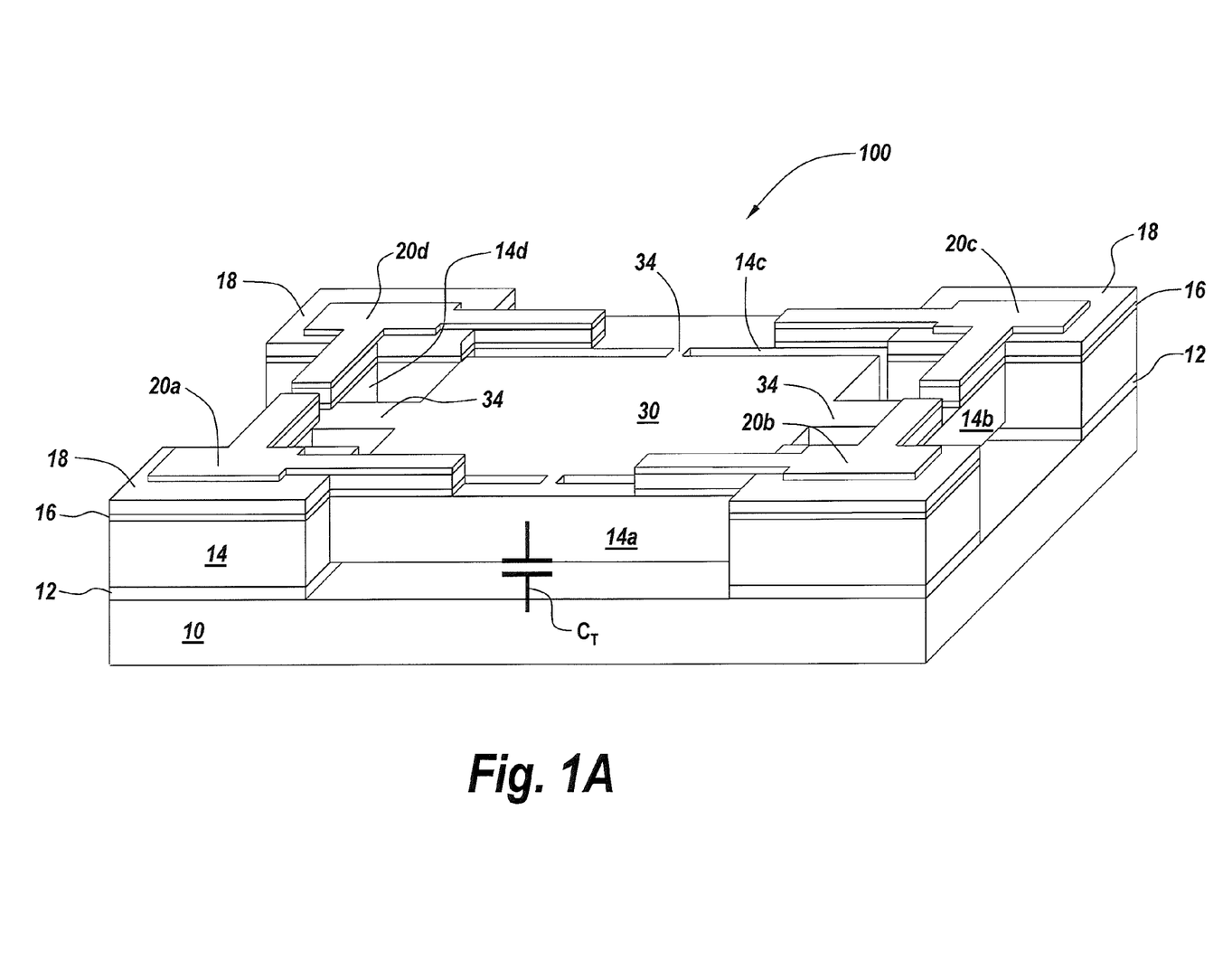
FIGS. 1A-1B are perspective and plan views, respectively, of microelectromechanical resonators according to embodiments of the invention.
Figure 1B:
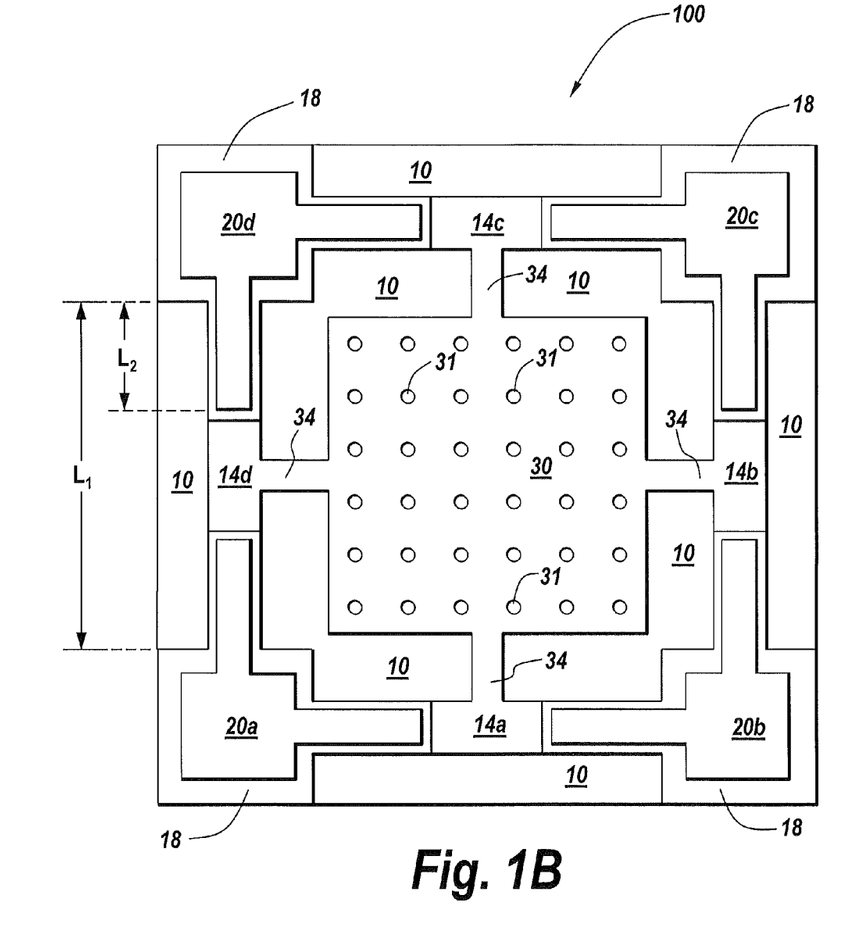

Referring now to FIGS. 1A-1B, microelectromechanical resonators 100 according to embodiments of the invention are illustrated as including a semiconductor-on-insulator (SOI) substrate, which contains a semiconductor handle layer 10, a buried insulating layer 12 (e.g., silicon dioxide) on the semiconductor handle layer 10 and a semiconductor resonator body layer 14 (e.g., monocrystalline silicon) on the buried insulating layer 12. The resonator body layer 14 is illustrated as including a suspended four-sided frame-shaped beam 14a-14d, which is anchored at four corners thereof to the surrounding SOI substrate. The semiconductor resonator body layer 14 also includes a suspended resonator plate 30, which is anchored by tethers 34 on four sides thereof to corresponding sides of the frame-shaped beam 14a-14d. As illustrated, these tethers 34 are connected at mid-points of the corresponding sides of the beams 14a-14d, which are each configured in a clamped-clamped beam configuration. The central suspended resonator plate 30 and surrounding frame-shaped beam 14a-14d may be formed by selectively etching the resonator body layer 14 and the underlying buried insulating layer 12 using conventional techniques, such as deep reactive-ion etching (DRIE) and those disclosed in U.S. Pat. Nos. 7,924,119, 7,888,843 and 7,843,284 to Ayazi et al. and U.S. Patent Publication No. 2010/0319185 to Ayazi et al., the disclosures of which are hereby incorporated herein by reference. The steps of selectively etching the resonator body layer 14 may include forming a two-dimensional array of closely-spaced release holes 31 within the resonator plate to thereby enable complete removal of portions of the buried insulating layer 12 extending underneath the resonator plate 30.

The resonator 100 illustrated by FIGS. 1A-1B also includes a pair of drive electrodes 20a, 20c on first and third diametrically opposite corners of the frame-shaped beam 14a-14d and a pair of sense electrodes 20b, 20d on second and fourth diametrically opposite corners of the frame-shaped beam 14a-14d. To achieve maximum displacement during resonance, a first of the pair of drive electrodes 20a (or 20c) may overlap a corresponding side of the frame-shaped beam by a length $L_2$, which is equal to about one-third $L_1$, the length of the side of the frame-shaped beam containing two electrodes, as illustrated by FIG. 1B. The resonator 100 may also include a ground electrode 16 on the frame-shaped beam 14a-14d and a piezoelectric layer 18 (e.g., AlN) sandwiched between each of the drive and sense electrodes 20a-20d and the ground electrode 16. The drive, sense and ground electrodes may be formed as molybdenum (Mo) electrodes.

Figure 2:
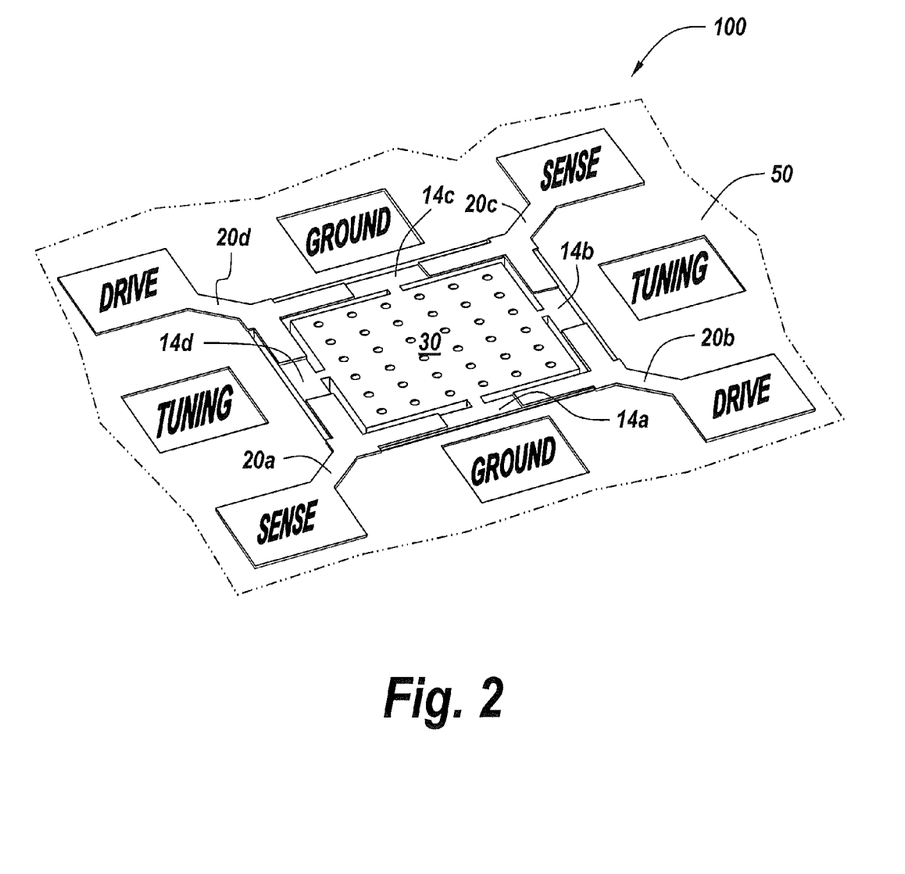
FIG. 2 is a perspective view of a passivated microelectromechanical resonator according to embodiments of the invention.

FIGS. 1A and 2 illustrate the layout of a passivated resonator 100 having four terminals (drive, sense, ground and tuning) on an upper surface of an electrically insulating passivation layer 50 or within openings in the passivation layer 50. As illustrated by FIG. 1A, the portion of the semiconductor handle layer 10 underneath the suspended resonator plate 30 may operate as a tuning electrode of a tuning capacitor ($C_T$), which can be biased with an adjustable DC voltage to achieve a desired resonant frequency of the resonator 100. This adjustable DC voltage may be applied to the tuning terminal illustrated by FIG. 2, which is electrically coupled to the underlying handle layer 10 using conventional techniques.

Figure 3:
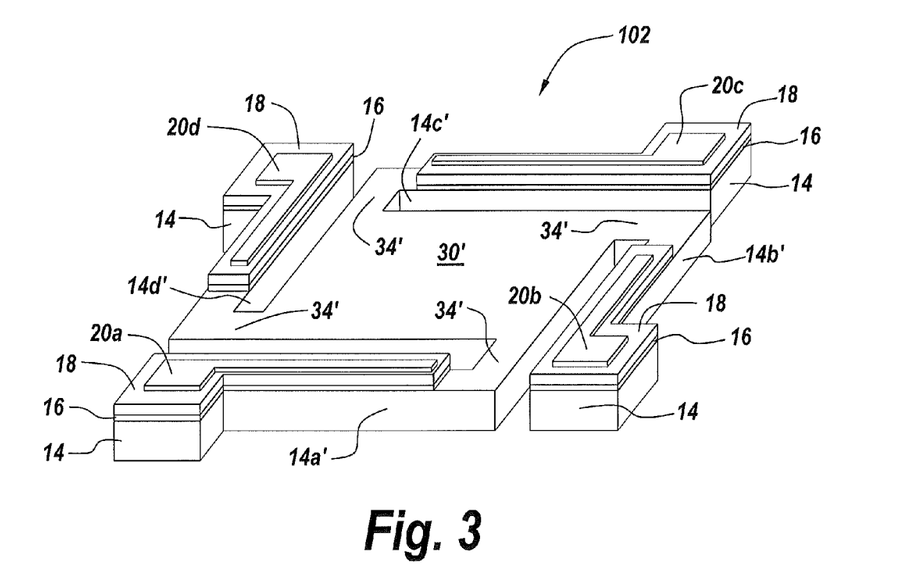
FIGS. 3-5 are perspective views of microelectromechanical resonators according to embodiments of the present invention.

FIG. 3 illustrates a piezoelectric resonator 102 containing a quad-arrangement of suspended beams 14a'-14d', which are anchored at respective first ends thereof to a substrate, a quad-arrangement of electrodes 20a-20d on the first ends of the quad-arrangement of suspended beams 14a'-14d', and corresponding piezoelectric layers 18 and ground electrodes 16. For ease of understanding, the semiconductor handle layer 10, buried insulating layer 12 and tuning electrode illustrated by FIGS. 1A-1B and 2, which can be additional components of the resonator structure 102 (and 104, 106), have been omitted from underneath the semiconductor resonator body layers 14 illustrated by FIG. 3 (and FIGS. 4-5). The piezoelectric resonator 102 of FIG. 3 further includes a suspended electrode-free mass-compensating plate 30', which is anchored (by tethers 34') on respective sides thereof to corresponding ones of the quad-arrangement of suspended beams 14a'-14d'

Figure 4:
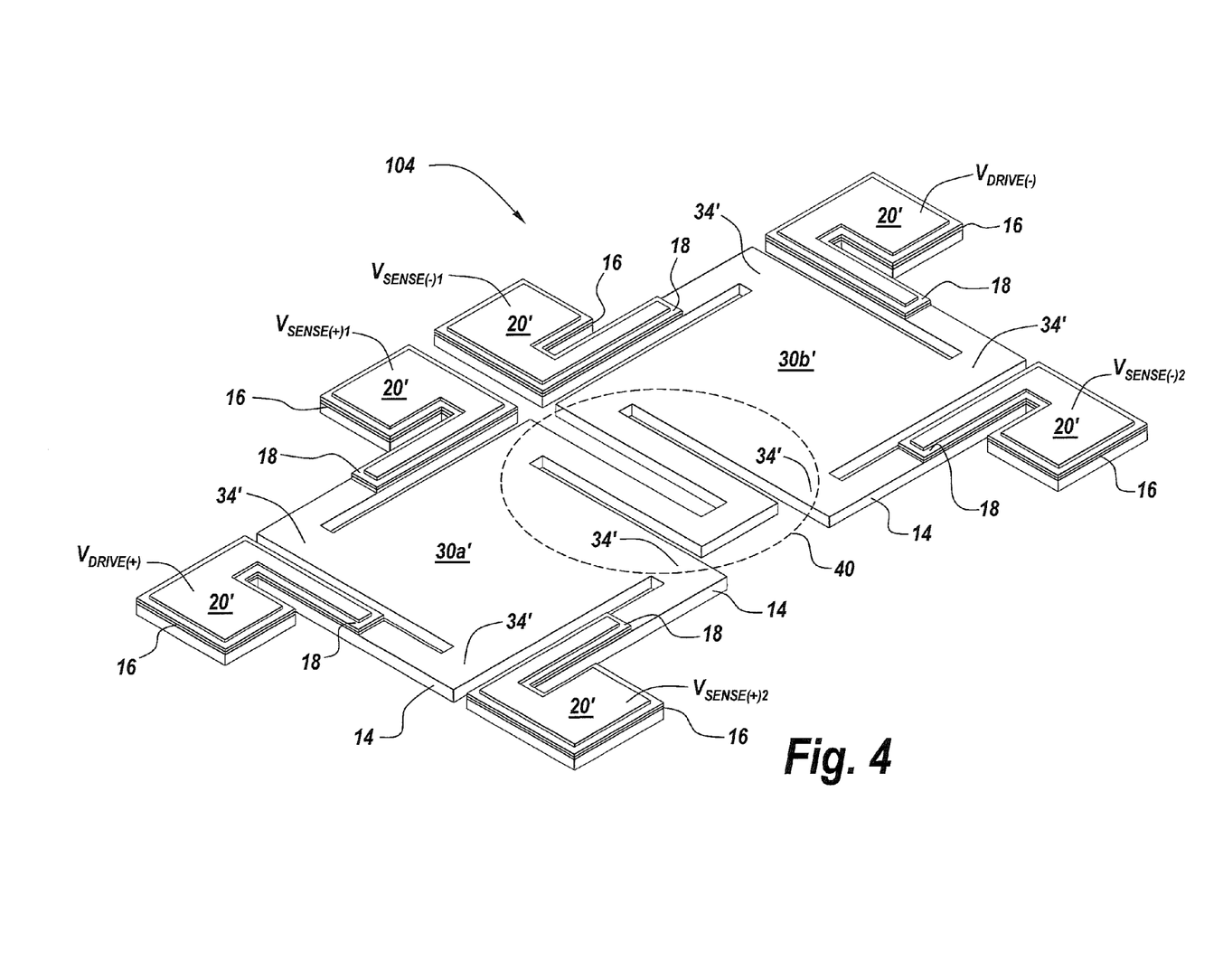

FIG. 4 illustrates a piezoelectric resonator structure 104 containing six suspended beams 14, which are patterned into a quad arrangement-plus-two beam configuration, six electrodes 20', including two drive electrodes ($V_{DRIVE(+)}$, $V_{DRIVE(-)}$) and four sense electrodes ($V_{SENSE(+)1}$, $V_{SENSE(-)1}$, $V_{SENSE(+)2}$, $V_{SENSE(-)2}$), corresponding piezoelectric layers 18 and ground electrodes 16 underneath the drive and sense electrodes 20', and a suspended electrode-free mass-compensating plate 30a', 30b', which is anchored at six points (by tethers 34') to corresponding ones of the six beams 14. This mass-compensating plate 30a', 30b' further includes a coupling spring 40 extending between plate regions 30a' and 30b', as illustrated.

Figure 5:
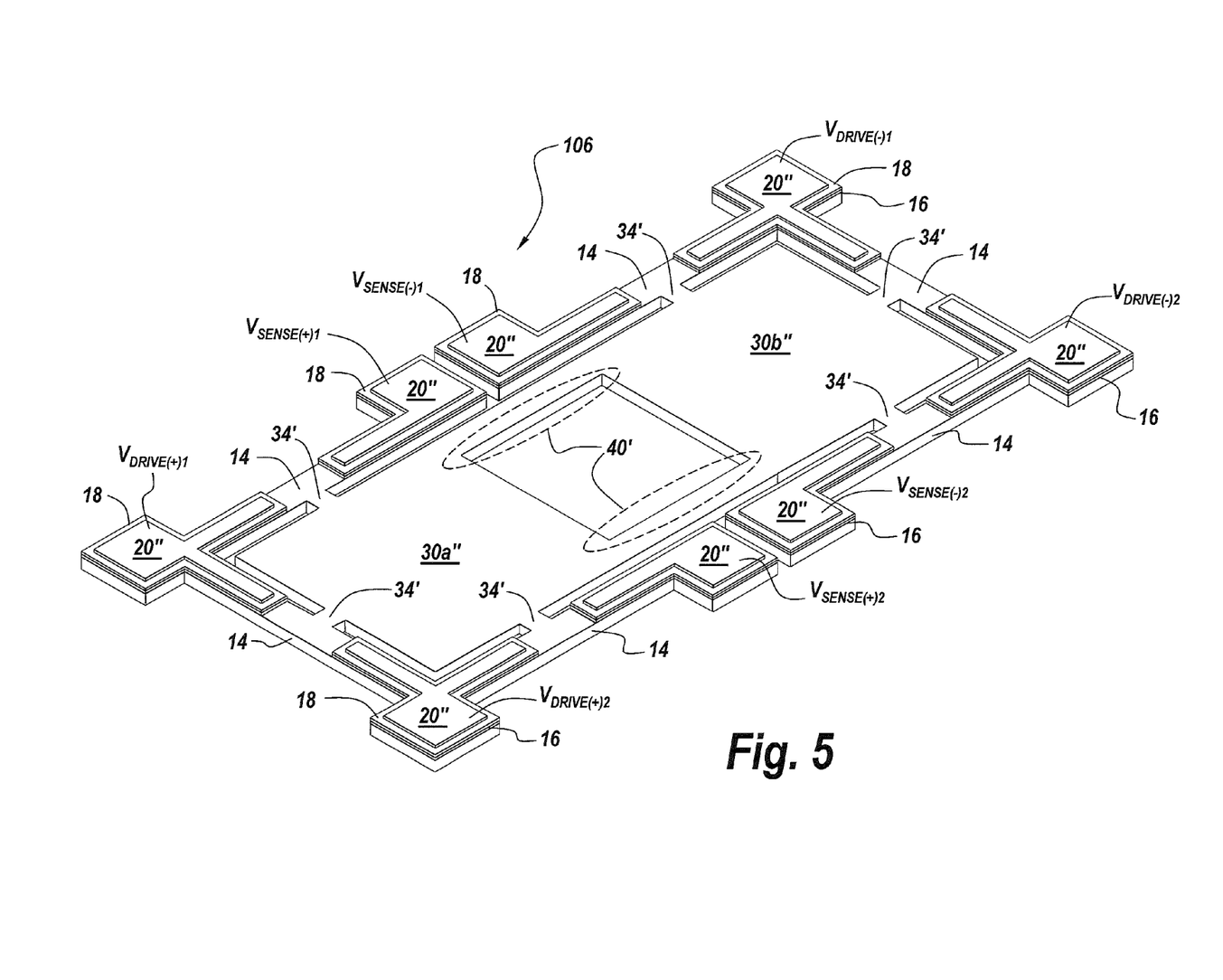

FIG. 5 illustrates a piezoelectric resonator structure 106 containing six suspended beams 14 arranged in a clamped-clamped configuration, eight electrodes 20", including four drive electrodes ($V_{DRIVE(+)1}$, $V_{DRIVE(-)1}$, $V_{DRIVE(+)2}$, $V_{DRIVE(-)2}$) and four sense electrodes ($V_{SENSE(+)1}$, $V_{SENSE(-)1}$, $V_{SENSE(+)2}$, $V_{SENSE(-)2}$), corresponding piezoelectric layers 18 and ground electrodes 16 underneath the drive and sense electrodes 20', and a suspended electrode-free mass-compensating plate 30a", 30b", which is anchored at six points (by tethers 34') to corresponding ones of the six beams 14. This mass-compensating plate 30a", 30b" further includes a pair of coupling springs 40' extending between plate regions 30a" and 30b", as illustrated.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A micromechanical resonator operable in a flexural mode, comprising:
    a suspended frame-shaped beam anchored at four corners thereof to a surrounding substrate;
    a suspended resonator plate tethered on four sides thereof to corresponding sides of said frame-shaped beam;
    a pair of drive electrodes on first and third diametrically opposite corners of said frame-shaped beam; and
    a pair of sense electrodes on second and fourth diametrically opposite corners of said frame-shaped beam.

2. The resonator of claim 1, further comprising a ground electrode on said frame-shaped beam and a piezoelectric layer sandwiched between each of said drive and sense electrodes and the ground electrode.

3. The resonator of claim 2, wherein said frame-shaped beam comprises monocrystalline silicon.

4. The resonator of claim 2, wherein said resonator plate and the four sides of said frame-shaped beam are suspended opposite a semiconductor handle layer; and wherein a buried electrically insulating layer extends between the semiconductor handle layer and the four corners of said frame-shaped beam.

5. The resonator of claim 4, further comprising a tuning electrode on the substrate, said tuning electrode electrically coupled to a portion of the semiconductor handle layer extending opposite said resonator plate.

6. The resonator of claim 2, wherein a first side of said frame-shaped beam has a length $L_1$; and wherein a first of the pair of drive electrodes overlaps the first side of said frame-shaped beam by a length $L_2$, which is equal to about one-third $L_1$.

7. A piezoelectric resonator, comprising:
    a quad-arrangement of suspended beams anchored at respective first ends thereof to a substrate;
    a quad-arrangement of electrodes on the first ends of said quad-arrangement of suspended beams; and
    a suspended electrode-free mass-compensating plate anchored on respective sides thereof to corresponding ones of said quad-arrangement of suspended beams.

8. The resonator of claim 7, further comprising a tuning electrode capacitively coupled to said mass-compensating plate.

9. The resonator of claim 8, wherein said substrate comprises a buried electrically insulating layer sandwiched between first and second single crystal semiconductor layers.

10. The resonator of claim 7, wherein said mass-compensating plate comprises at least one coupling spring.

11. The resonator of claim 7, wherein each of said quad-arrangement of suspended beams is arranged in a clamped-clamped beam configuration.

12. The resonator of claim 11, wherein said quad-arrangement of suspended beams comprises a frame-shaped beam anchored at four corners thereof to the substrate.

13. The resonator of claim 12, wherein said mass-compensating plate is tethered on four sides thereof to corresponding sides of the frame-shaped beam.

14. The resonator of claim 11, wherein said mass-compensating plate comprises a pair of coupling springs.

15. The resonator of claim 7, wherein each electrode in the quad-arrangement of electrodes is separated from a corresponding one of the quad-arrangement of suspended beams by a respective piezoelectric region.

16. A micromechanical resonator, comprising:
    a first semiconductor layer;
    a buried electrically insulating layer on the first semiconductor layer, said buried electrically insulating layer having an opening therein that exposes an upper surface of the first semiconductor layer;
a second semiconductor layer on said buried electrically insulating layer, said second semiconductor layer comprising:
a suspended frame-shaped beam anchored at four corners thereof to surrounding portions of said second semiconductor layer; and
an electrode-free resonator plate that is tethered on four sides thereof to corresponding sides of the frame-shaped beam;
a pair of drive electrodes on first and third diametrically opposite corners of said frame-shaped beam; and
a pair of sense electrodes on second and fourth diametrically opposite corners of said frame-shaped beam.

17. The resonator of claim 16, wherein said electrode-free resonator plate is suspended opposite the opening in the buried electrically insulating layer.

18. The resonator of claim 17, further comprising a frequency tuning electrode on said second semiconductor layer, said tuning electrode electrically coupled to a portion of the first semiconductor layer within the opening in said buried electrically insulating layer.

19. The resonator of claim 18, further comprising a ground electrode on the frame-shaped beam and a piezoelectric layer sandwiched between each of said drive and sense electrodes and the ground electrode.

20. The resonator of claim 19, wherein said ground electrode is capacitively coupled to the portion of the first semiconductor layer within the opening.

* * * * *